United States Patent [19]

Iwamatsu

[11] Patent Number: 4,899,150
[45] Date of Patent: Feb. 6, 1990

[54] DIGITAL SIGNAL PROCESSING CIRCUIT
[75] Inventor: Masayuki Iwamatsu, Hamamatsu, Japan
[73] Assignee: Yamaha Corporation, Hamamatsu, Japan
[21] Appl. No.: 171,687
[22] Filed: Mar. 22, 1988
[30] Foreign Application Priority Data Mar. 26, 1987 [JP] Japan .................................. 62-72600

[51] Int. Cl.⁴ ............................................. H03M 1/08
[52] U.S. Cl. ...................................... 341/118; 341/138
[58] Field of Search ............... 341/118, 119, 120, 131, 341/115, 138, 140

[56] References Cited

U.S. PATENT DOCUMENTS 4,308,524 12/1981 Harrison et al. ..................... 341/138
4,465,996 8/1984 Boyacigiller et al. ............... 341/118
4,490,714 12/1984 Van de Plassche et al. ........ 341/138

Primary Examiner—William M. Shoop, Jr.
Assistant Examiner—Brian Young
Attorney, Agent, or Firm—Spensley Horn Jubas & Lubitz

[57] ABSTRACT

A digital signal processing circuit comprises a digital signal processing section receiving signal data for subjecting the input digital signal data to digital signal processing such as digital filtering or digital equalizing, a data offset imparting circuit receiving output of the digital signal processing section for imparting data offset to the input digital signal data, and a digital-to-analog converter receiving output of the data offset imparting circuit for converting the input digital signal data to analog signal data and delivering out the analog signal data. Data offset is imparted to digital signal data in digital stage after being subjected to a digital signal processing so that a minute fluctuation due to background noise causes little change in MSB in an input to the digital-to-analog converter during inputting of signal data of a small level and linearity adjustment in MSB can be made without causing deterioration in the signal-to-noise ratio in the digital-to-analog converter.

2 Claims, 4 Drawing Sheets

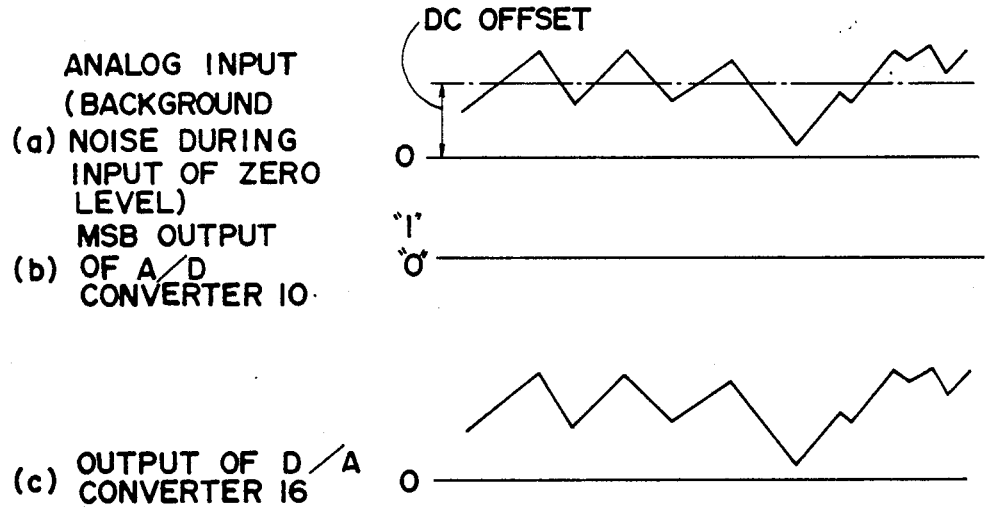
F I G. 5
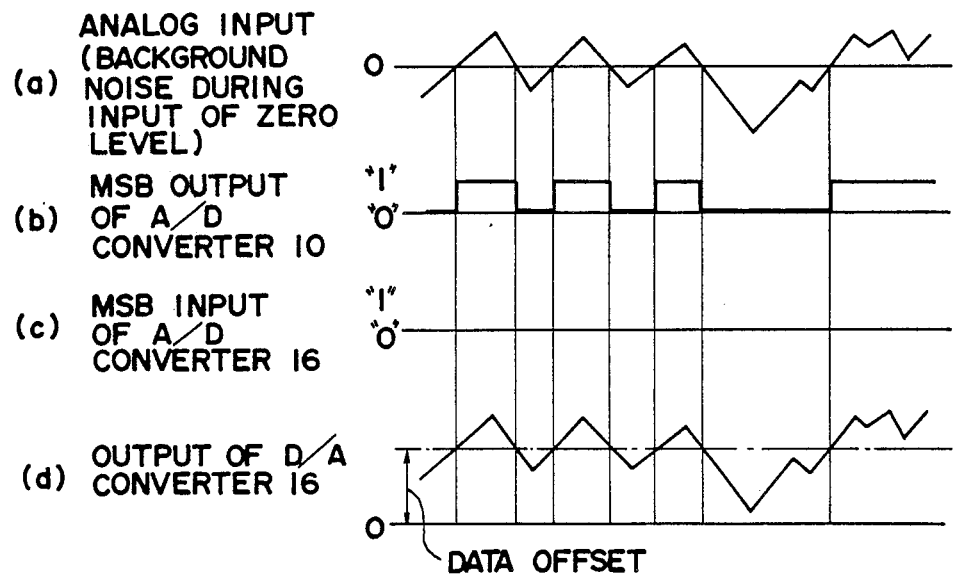
F I G. 6

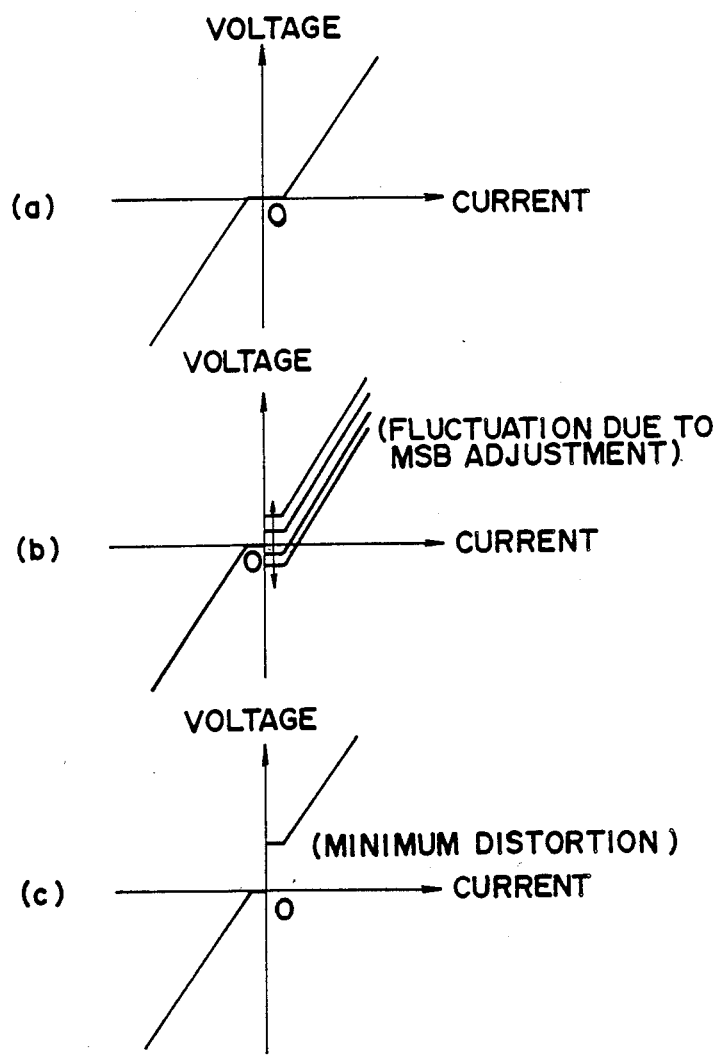
F I G. 7

DIGITAL SIGNAL PROCESSING CIRCUIT

BACKGROUND OF THE INVENTION

This invention relates to a digital signal processing circuit for subjecting digital signal data to a digital signal processing and outputting the processed data after digital-to-analog conversion and, more particularly, to a digital signal processing circuit capable of preventing ocurrence of noise in an output of a digital-to-analog converter due to linearity adjustment therein.

A digital-to-analog converter of N bits is constructed in such a manner that weighted N current sources are turned on and off with respective bit signals of digital signal data and outputs of these current sources are added together and subjected to current-to-voltage conversion. Among the current sources, one corresponding to MSB (the most significant bit) is of the largest current value and this current source is utilized for adjusting linearity of the digital-to-analog converted output.

The adjustment of linearity of a digital-to-analog converter will be briefly described with reference to FIG. 7. Characteristics of components such as a current-to-voltage converting amplifier in a digital-to-analog converter often have an insensitive region in the vicinity of a zero-crossing point as shown in FIG. 7(a). By altering current value of MSB as shown in FIG. 7(b), the current value becomes one as shown in FIG. 7(c) and linearity of the conversion output thereby is improved. In other words, distortion component as a whole is minimized by this adjustment. This adjustment, however, causes, in most cases, the current value of MSB to be deviated from a value which is proper to MSB with a result that an error in MSB itself becomes large.

In digital data relating to positive and negative inputs such as 2's complement signal and offset binary signal in which MSB is inverted at a boundary between a positive region and a negative region, this error in MSB causes deterioration in signal-to-noise ratio when an original analog signal of a small level is applied.

Even when the input level of an original analog signal is zero, there is actually produced a background noise as shown in FIG. 2(a) in the original analog signal and this background noise fluctuates between small positive and negative values. Due to this background noise, the MSB output of the analog-to-digital converter fluctuates as shown in FIG. 2(b) and, when this output is digital-to-analog converted, the MSB error due to the linearity adjustment is added to the background noise as shown in FIG. 2(c) so that the noise level increases with resulting deterioration in the signal-to-noise ratio. Alternatively stated, if the value of MSB current is changed for the linearity adjustment, the signal-to-noise ratio of a digital-to-analog converter is changed as shown by a curve ⓐ in FIG. 3. At a point at which the signal-to-noise ratio is the best, the amount of noise is reduced to −6 dB. A digital-to-analog converted output which has the best signal-to-noise ratio with respect to the background noise of FIG. 2(a) is shown in FIG. 2(d). The linearity of the digital-to-analog converter output, however, generally hardly becomes the best at the best point of the signal-to-noise ratio and the best linearity generally causes deterioration in the signal-to-noise ratio.

For solving this problem, a digital signal processing circuit may be so constructed that a positive or negative analog DC offset is imparted to an input original analog signal when the original analog signal is of a small level so as to prevent a minute fluctuation due to background noise component from causing change in MSB in an analog-to-digital converted output. In this circuit, as shown in FIG. 4, a constant DC offset is imparted to an analog input by a mixer 14 and the analog input is converted to digital signal data by an analog-to-digital converter 10. This digital signal data is processed in a manner as required and thereafter is converted to an analog signal again by a digital-to-analog converter 16 and delivered out.

According to this circuit, the background noise which is produced during inputting of an original analog signal of a zero level has a smaller possibility of crossing the zero level owing to the DC offset imparted thereto as shown in FIG. 5(a) and, accordingly, the MSB output of the analog-to-digital converter 10 has a smaller possibility of being inverted as shown in FIG. 5(b) so that increase in the noise is prevented as shown by line ⓑ in FIG. 3 when the MSB linearity adjustment is performed in the digital-to-analog converter 16 which receives this digital signal data.

Even when noise of a relatively large magnitude occurs and crosses the zero level, it is so seldom that the signal-to-noise ratio as a whole is not significantly affected.

As the input level of an original analog signal increases, an original analog signal waveform comes to cross the zero level periodically. This however does not take place constantly as in the case of the background noise shown in FIG. 2(a) but it occurs at a long interval. Besides, this occurs when the signal component in the signal-to-noise ratio has become substantially large. Accordingly, such crossing of the zero level by the original analog signal does not significantly affect the signal-to-noise ratio.

Therefore, even if the MSB error is produced due to the linearity adjustment, it is possible to prevent the signal-to-noise ratio from deteriorating by imparting the DC offset to an original analog input in an analog stage before analog-to-digital conversion as shown in FIG. 4.

In recently developed digital signal processings performed in a digital signal processing section for processing a digital audio signal and other digital signals, processings involving change in frequency characteristics such as digital filtering and digital equalizing are increasing. In these processings, DC components are often cut off from digital signal data.

This poses the problem on the circuit as shown in FIG. 4 that, even if the DC offset is imparted to an original analog signal, this DC offset is cut off in the process of subsequent digital signal processing with a result that the effect of imparting of the DC offset is not obtained and deterioration in the signal-to-noise ratio occurs in the digital-to-analog converter 16 particularly during inputting of an original analog signal of a small level.

It is, therefore, an object of the invention to provide a digital signal processing circuit in which an offset component is not cut off even during a digital signal processing which involves change in frequency characteristics and thereby causes DC components to be substantially cut off so that adjustment of linearity can be made without causing deterioration in the signal-to-noise ratio of a digital-to-analog converter provided on the output side.

SUMMARY OF THE INVENTION

For achieving the above described object of the invention, it is a feature of the invention to impart data offset to digital signal data after being subjected to a digital signal processing and before being subjected to digital-to-analog conversion.

A digital signal processing circuit according to the invention comprises digital signal processing means receiving digital signal data for subjecting the input digital signal data to digital signal processing, data offset imparting means receiving output of said digital signal processing means for imparting data offset to the input digital signal data, and digital-to-analog conversion means receiving output of said data offset imparting means for converting the input digital signal data to analog signal data and delivering this analog signal data.

According to the invention, data offset is imparted to digital signal data in digital stage after being subjected to a digital signal processing so that a minute fluctuation due to background noise component causes little change in MSB in an input to the digital-to-analog converter during inputting of signal data of a small level whereby the linearity adjustment in MSB can be made without causing deterioration in the signal-to-noise ratio in the digital-to-analog converter.

According to the invention, as distinguished from imparting of the DC offset, data offset is imparted in a digital fashion to digital signal data after being subjected to the digital signal processing so that the data offset is not cut off but the above described effect can be obtained even in a case where the digital signal processing involves change in frequency characteristics as in the case of handling an audio signal.

A preferred embodiment of the invention will now be described with reference to the accompanying drawings.

BRIEF DESCRIPTION OF THE DRAWINGS

In the accompanying drawings,

FIG. 5 is a waveform diagram showing operation of the circuit of FIG. 4;

FIG. 6 is a waveform diagram showing operation of the circuit of FIG. 1; and

FIG. 7 is a diagram for explaining linearity adjustment of a digital-to-analog converter by MSB adjustment.

DESCRIPTION OF A PREFERRED EMBODIMENT

Figure 1:
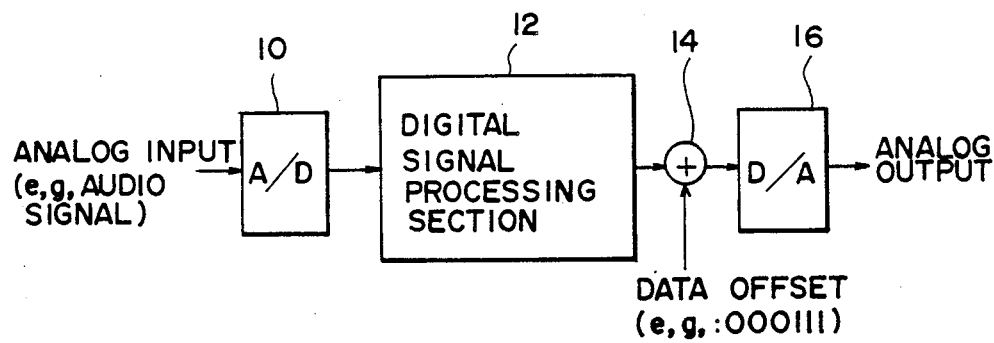
FIG. 1 is a block diagram showing an embodiment of the digital signal processing circuit according to the invention.
Figure 2:
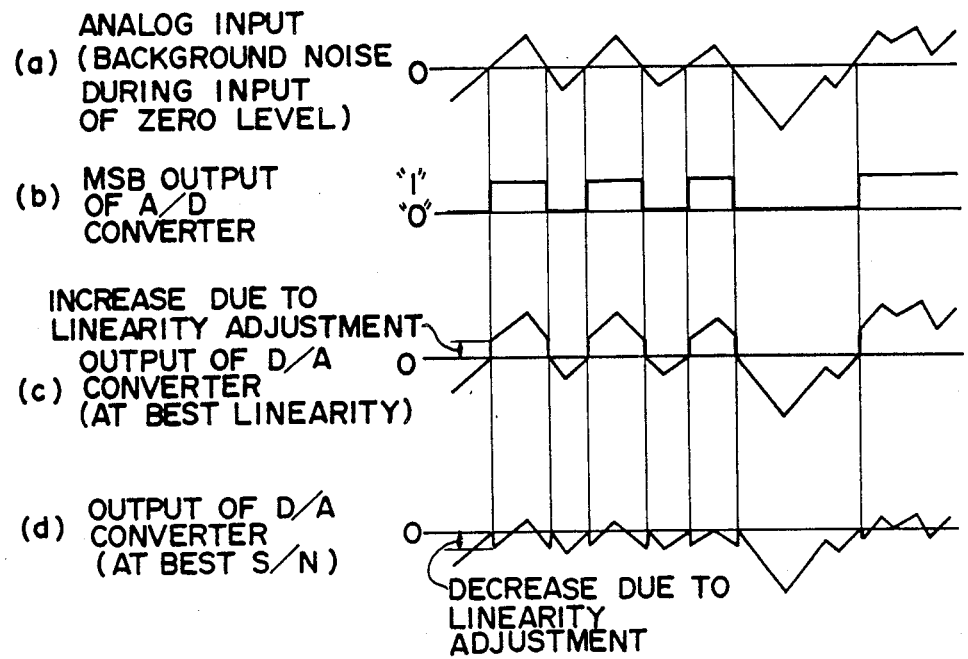
FIG. 2 is a waveform diagram showing operation of the digital signal processing circuit during inputting of zero level when offset is not imparted.

FIG. 1 shows an embodiment of the digital signal processing circuit according to the invention. An analog input (e.g., audio signal) is converted to digital signal data by an analog-to-digital converter 10. This digital signal data is applied to a digital signal processing section 12 in which the digital signal data is subjected to digital signal processing such as digital filtering or digital equalizing which involves change in frequency characteristics or otherwise causes a DC component in the data to be cut off.

Figure 4:
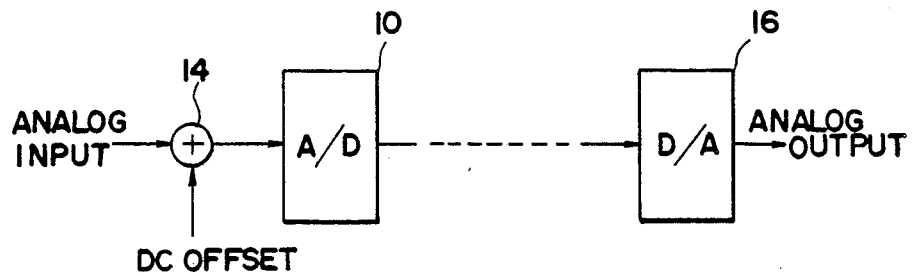
FIG. 4 is a block diagram showing the digital signal processing circuit imparting DC offset.

The digital signal data which has thus been subjected to the digital signal processing is added by a mixer 14 provided in a final stage with data offset component which is digital data of a constant value and corresponds to the DC offset shown in FIG. 4. Then the digital signal data added with the data offset is converted by a digital-to-analog converter 16 to an analog signal.

The value of the data offset is set to such value that the input MSB of the digital-to-analog converter 16 will not operate substantially within amplitude range of background noise transmitted from the digital signal processing section 12.

If necessary, the data offset component may be cut off in an analog signal state after the digital-to-analog conversion. Since, however, the added data offset is of a value corresponding to a small level which is sufficient for preventing inversion of MSB due to background noise during inputting of data of a small level, such necessity for cutting off the data offset component seldom occurs.

According to the circuit of FIG. 1, when the output digital signal data of the analog-to-digital converter 10 is one such as 2's complement signal or offset binary signal in which MSB is inverted at a boundary of a positive region and a negative region, the input of the analog-to-digital converter 10 constantly crosses the zero level during inputting of the zero level as shown in FIG. 6(a) and its MSB output repeats inversion as shown in FIG. 6(b). This inversion of MSB per se does not substantially have an adverse effect in the digital signal processing performed in the digital signal processing section 12. Since data offset is newly imparted to the digital signal data in a digital fashion after the digital signal processing, the MSB input to the final digital-to-analog converter 16 seldom or never inverts as shown in FIG. 6(c) so that the output of the digital-to-analog converter 16 contains little noise increment due to the MSB error as shown in FIG. 6(d). Since, further, data offset is imparted after the digital signal processing in the digital signal processing section 12, the imparted data offset is not cut off even if the digital signal processing section 12 is one such as a digital filter, digital equalizer, digital effector or digital reverberator which involves change in frequency characteristics or otherwise causes DC component in data to be cut off.

Figure 3:
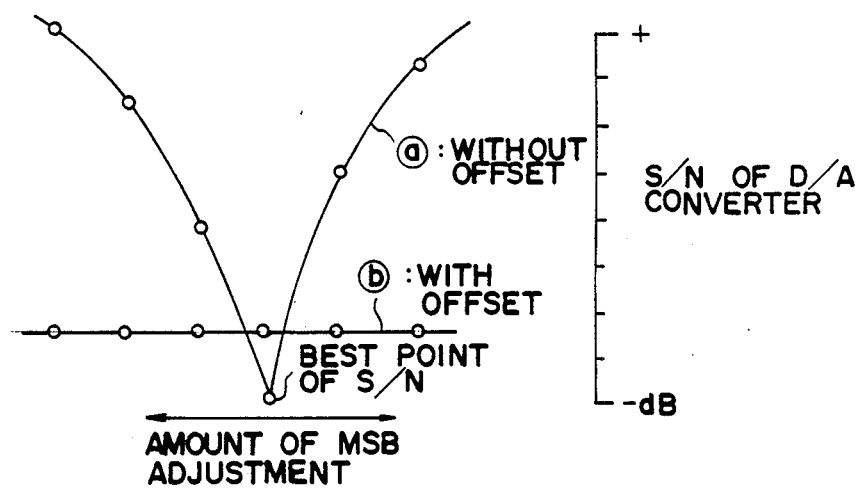
FIG. 3 is a diagram showing change in the signal-to-noise ratio of the digital-to-analog converter output with the amount of MSB adjustment with respect to a case where offset has been imparted and a case where no offset has been imparted.

As a result, the linearity adjustment due to MSB in the digital-to-analog converter 16 does not cause increase in noise as shown by line ⓑ in FIG. 3 whereby linearity can be adjusted to the best condition while preventing deterioration in the signal-to-noise ratio.

What is claimed is:

1. A digital signal processing circuit comprising:
digital signal processing means for receiving input digital signal data and subjecting the input digital signal data to digital signal processing in which frequency characteristics of the digital signal data are changed;
data offset means receiving output of said digital signal processing means for providing data offset to the input digital signal data; and
digital-to-analog conversion means receiving an output of said data offset means for converting the input digital signal; data to analog voltage signal data and delivering this analog voltage signal data, said digital-to-analog conversion means including plural weighted current sources corresponding to the number of bits of the conversion means which are turned on and off by respective bit signals and a current-to-voltage converter for converting the summed current from the current sources to said analog voltage signal data, wherein the current value provided by the current source corresponding to the most significant bit of the conversion means is set at a value different from its proper weighted value in comparison with the other current sources so as to improve linearity of conversion.

2. A digital signal processing circuit as defined in claim 1 wherein said digital signal data is a digital audio signal.

* * * * *